United States Patent
Mopidevi et al.

(10) Patent No.: US 12,237,155 B2
(45) Date of Patent: *Feb. 25, 2025

(54) MAGNETIC SHIELDING FOR PLASMA SOURCES

(71) Applicant: Lam Research Corporation, Fremont, CA (US)

(72) Inventors: Hema Swaroop Mopidevi, Fremont, CA (US); Neil Martin Paul Benjamin, Palo Alto, CA (US); John Pease, San Mateo, CA (US); Thomas Anderson, Hayward, CA (US)

(73) Assignee: Lam Research Corporation, Fremont, CA (US)

( * ) Notice: Subject to any disclaimer, the term of this patent is extended or adjusted under 35 U.S.C. 154(b) by 226 days.

This patent is subject to a terminal disclaimer.

(21) Appl. No.: 17/506,538

(22) Filed: Oct. 20, 2021

(65) Prior Publication Data

US 2022/0044864 A1 Feb. 10, 2022

Related U.S. Application Data

(62) Division of application No. 16/045,635, filed on Jul. 25, 2018, now Pat. No. 11,177,067.

(51) Int. Cl.
*H01J 37/32* (2006.01)
*H01F 27/36* (2006.01)
*H01L 21/683* (2006.01)

(52) U.S. Cl.
CPC ........ *H01J 37/32651* (2013.01); *H01F 27/36* (2013.01); *H01F 27/366* (2020.08);
(Continued)

(58) Field of Classification Search
CPC .............. H01J 37/32091; H01J 37/321; H01J 37/3211; H01J 37/32119; H01J 37/32183;
(Continued)

(56) References Cited

U.S. PATENT DOCUMENTS 5,683,548 A * 11/1997 Hartig ................... H01J 37/321
438/711
5,994,236 A * 11/1999 Ogle ..................... H01J 37/321
438/732
(Continued)

FOREIGN PATENT DOCUMENTS

JP 2004241592 8/2004
JP 2012522330 9/2012
(Continued)

OTHER PUBLICATIONS

U.S. Appl. No. 16/045,635, Advisory Action mailed Feb. 9, 2021, 6 pgs.
(Continued)

*Primary Examiner* — Kurt Sweely
(74) *Attorney, Agent, or Firm* — Schwegman Lundberg & Woessner, P.A.

(57) ABSTRACT

In some examples, a magnetic shield for a plasma source is provided. An example magnetic shield comprises a back-shell. The back-shell includes a cage defined, at least in part, by an arrangement of bars of ferro-magnetic material. The cage is sized and configured to at least extend over a top side of an RF source coil for the plasma source.

11 Claims, 9 Drawing Sheets

(52) U.S. Cl.
CPC ...... *H01J 37/321* (2013.01); *H01J 37/32669* (2013.01); *H01J 37/32091* (2013.01); *H01J 37/32183* (2013.01); *H01L 21/6831* (2013.01)

(58) Field of Classification Search
CPC ........... H01J 37/32486; H01J 37/32495; H01J 37/32504; H01J 37/32541; H01J 37/3255; H01J 37/32559; H01J 37/32577; H01J 37/32651; H01J 37/3266; H01J 37/32669; H01J 37/32678; H01J 37/32477–32504; H01F 27/366; H01F 27/36; H01L 21/6831
See application file for complete search history.

(56) References Cited

U.S. PATENT DOCUMENTS

| | | | | |
|---|---|---|---|---|
| 6,259,209 | B1* | 7/2001 | Bhardwaj | H05H 1/46 315/111.41 |
| 6,273,022 | B1* | 8/2001 | Pu | H01J 37/321 118/723 MR |
| 6,321,681 | B1 | 11/2001 | Colpo et al. | |
| 6,447,636 | B1* | 9/2002 | Qian | H01J 37/32009 156/345.48 |
| 7,255,774 | B2* | 8/2007 | Vukovic | H01J 37/321 118/723 AN |
| 8,755,204 | B2 | 6/2014 | Benjamin | |
| 9,384,948 | B2 | 7/2016 | Long et al. | |
| 11,177,067 | B2 | 11/2021 | Mopidevi et al. | |
| 2003/0067273 | A1* | 4/2003 | Benjamin | H01J 37/321 315/111.21 |
| 2004/0060517 | A1 | 4/2004 | Vukovic et al. | |
| 2004/0175953 | A1* | 9/2004 | Ogle | H01J 37/321 438/710 |
| 2005/0194099 | A1 | 9/2005 | Jewett et al. | |
| 2010/0244699 | A1 | 9/2010 | Dine | |
| 2011/0092072 | A1 | 4/2011 | Singh et al. | |
| 2011/0278260 | A1* | 11/2011 | Lai | C23C 16/509 216/68 |
| 2012/0034394 | A1* | 2/2012 | Shajii | H01J 37/32357 427/571 |
| 2014/0367045 | A1 | 12/2014 | Long et al. | |
| 2015/0191823 | A1* | 7/2015 | Banna | H05B 6/02 219/635 |
| 2016/0198524 | A1 | 7/2016 | Pease et al. | |
| 2020/0035409 | A1 | 1/2020 | Mopidevi et al. | |

FOREIGN PATENT DOCUMENTS

| | | |
|---|---|---|
| JP | 2021530852 | 11/2021 |
| KR | 100824304 B1 | 4/2008 |
| KR | 20080106417 A | 12/2008 |
| WO | WO-2020023784 A1 | 1/2020 |

OTHER PUBLICATIONS

U.S. Appl. No. 16/045,635, Final Office Action mailed Nov. 17, 2020, 12 pgs.
U.S. Appl. No. 16/045,635, Non Final Office Action mailed Jun. 23, 2020, 13 pgs.
U.S. Appl. No. 16/045,635, Notice of Allowance mailed Jul. 14, 2021, 13 pgs.
U.S. Appl. No. 16/045,635, Response filed Jan. 18, 2021 to Final Office Action mailed Nov. 17, 2020, 11 pgs.
U.S. Appl. No. 16/045,635, Response filed Feb. 17, 2021 to Advisory Action mailed Feb. 9, 2021, 13 pgs.
U.S. Appl. No. 16/045,635, Response filed Apr. 20, 2020 to Restriction Requirement mailed Feb. 27, 2020, 5 pgs.
U.S. Appl. No. 16/045,635, Response filed Sep. 18, 2020 to Non Final Office Action mailed Jun. 23, 2020, 11 pgs.
U.S. Appl. No. 16/045,635, Restriction Requirement mailed Feb. 27, 2020, 6 pgs.
International Application Serial No. PCT/US2019/043502, International Preliminary Report on Patentability mailed Feb. 4, 2021, 7 pgs.
International Application Serial No. PCT/US2019/043502, International Search Report mailed Dec. 3, 2019, 3 pgs.
International Application Serial No. PCT/US2019/043502, Written Opinion mailed Dec. 3, 2019, 5 pgs.
Gerst, Dennis Jan, "Investigation of Magnetized Radio Frequency Plasma Sources for Electric Space Propulsion", PhD Dissertation, University of Orleans, France, Retrieved from the Internet: <https://www.researchgate.net/publication/259580067_Investigation_of_Magnetized_Radio_Freciuency_Plasma_Sources_for_Electric_Space_Propulsion>, (Nov. 2013), 164 pgs.
Kim, Hongseok, et al., "Suppression of Leakage Magnetic Field from a Wireless Power Transfer System using Ferrimagnetic Material and Metallic Shielding", IEEE International Symposium on Electromagnetic Compatibility, Pittsburgh, PA, (2012), 640-645.
"Japanese Application Serial No. 2021-503907, Notification of Reasons for Refusal mailed May 9, 2023", w English Translation, 6 pgs.
Japanese Application Serial No. 2021-503907, Response filed Aug. 1, 2023 to Notification of Reasons for Refusal mailed May 9, 2023, w/ English claims, 7 pgs.
Korean Application Serial No. 10-2021-7005463, Notice of Preliminary Rejection mailed Jun. 29, 2024, w/ English translation, 13 pgs.
Korean Application Serial No. 10-2021-7005463, Response filed Aug. 29, 2024 to Notice of Preliminary Rejection mailed Jun. 29, 2024, w/ English translation, 37 pgs.

* cited by examiner

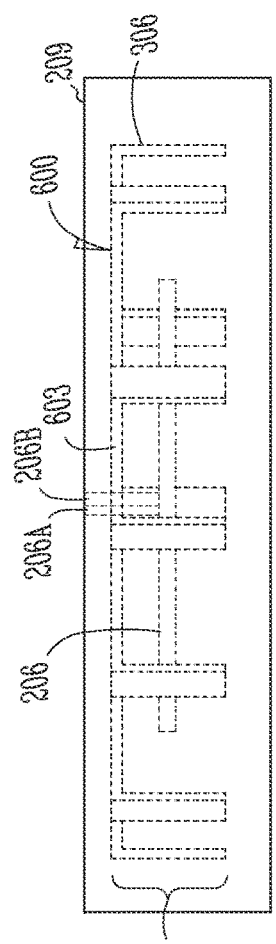
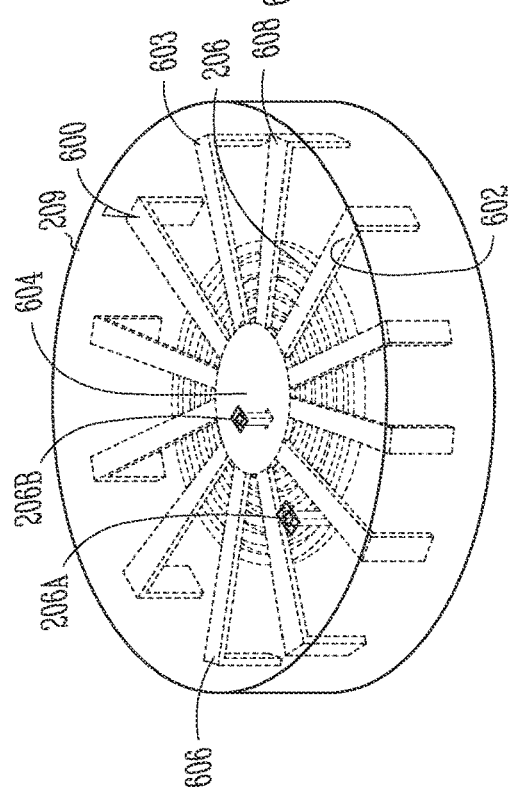

MAGNETIC SHIELDING FOR PLASMA SOURCES

CLAIM OF PRIORITY

This application is a divisional of and claims the benefit of priority under 35 U.S.C. § 120 to U.S. patent application Ser. No. 16/045,635, filed on Jul. 25, 2018, which is incorporated by reference herein in its entirety.

FIELD

The present disclosure relates generally to magnetic shielding for plasma sources which can be used, in one example, to reduce eddy current losses caused by plasma source enclosures.

BACKGROUND

Currently, in order to meet certain electro-magnetic compatibility and radio-frequency (RF) interference requirements in semi-conductor manufacturing, most if not all RF systems in etching, cleaning, and deposition tools are required to be enclosed in metallic enclosures. This requirement to deploy metallic enclosures can generally cause unwanted capacitive and/or inductive parasitic effects which can in turn affect the design of individual RF sub-systems and the overall RF system.

More particularly, in the case of plasma sources, the magnetic fields emanating out of the RF source coil produce circulating currents on the metallic enclosure which in turn produce heat and waste the otherwise useful power which ought to be delivered to the plasma for wafer processing purposes.

The present disclosure seeks to address, amongst other things, these drawbacks. It should be noted that the information described in this section is presented to provide the skilled artisan some context for the following disclosed subject matter and should not be considered as admitted prior art.

SUMMARY

In some examples, there is provided a magnetic shield for a plasma source, the magnetic shield comprising a back-shell (also termed a flux back-shell), the back-shell including a cage defined at least in part by an arrangement of bars of ferro-magnetic material, the cage sized and configured to at least extend over a top side of an RF source coil for the plasma source.

In some examples, the arrangement of ferro-magnetic bars defines an open cage having an open side; and wherein a bottom side of the RF source coil, when in use, faces the open side. In some examples, the arrangement of ferro-magnetic bars defines a closed cage. The cage may include at least a plate of ferro-magnetic material, the plate defining or included in at least one wall of the cage, and wherein the plate is disposed opposite of and parallel to the arrangement of ferro-magnetic bars.

In some examples, the ferro-magnetic material includes one or more of a group of materials comprising: a nickel zinc (NiZn) ferrite, a magnesium zinc (MgZn) ferrite, a ferrite made of Nickel Magnesium (NiMg) alloy, a manganese zinc (MnZn) ferrite, a powdered-iron, and a combination thereof. In some examples, the arrangement of ferro-magnetic bars defines at least a first wall of the cage, the arrangement including a first array of radially spaced bars extending between a first central region of the first wall of the cage and an outer dimension thereof. In some examples, the cage includes at least one wall having a circular shape. A circumference of the circular shape may be substantially equidistant from a circumference of an outer turn of the RF source coil. The first central region includes a central bar made of ferro-magnetic material. In another example, the arrangement of ferro-magnetic bars defines a second wall of the cage. The arrangement includes a second array of radially spaced bars extending between a second central region of the second wall and an outer dimension thereof, and wherein the first array is opposite of and parallel to the second array.

In some examples, the arrangement of ferro-magnetic bars includes an array of ferro-magnetic bars arranged orthogonally to each other, the orthogonal array of ferro-magnetic bar defining or included in at least one wall of the cage.

In some examples, a wafer processing chamber is provided. An example wafer processing chamber comprises an RF source coil for a chamber plasma source, and a magnetic shield comprising a back-shell, the back-shell comprising a cage defined at least in part by an arrangement of bars of ferro-magnetic material, the cage sized and configured to at least partially enclose the RF source coil. The back-shell in the wafer processing chamber may have one or more of the back-shell elements summarized above.

In some examples, a method of magnetically shielding an RF source coil for a plasma source is described. A back-shell for the RF source coil is provided. The back-shell includes a cage defined, at least in part, by an arrangement of bars of ferro-magnetic material. The cage is sized and configured to at least extend over a top side of the RF source coil. The RF source coil is disposed in the cage.

In some examples, the arrangement of ferro-magnetic bars defines an open cage having an open side. The RF source coil is disposed in the cage such that a bottom side of the RF source coil faces the open side of the cage.

In some examples, the cage further includes at least a plate of ferro-magnetic material, the plate defining or included in at least one wall of the cage; wherein the plate is disposed opposite of and parallel to the arrangement of ferro-magnetic bars; and wherein having the RF source coil disposed in the cage further comprises having the RF source coil disposed between the plate and the arrangement of ferro-magnetic bars.

DESCRIPTION OF THE DRAWINGS

Some embodiments are illustrated by way of example and not limitation in the figures of the accompanying drawings:

FIGS. 6A-6B are respective pictorial and side views of a magnetic shield, according to an example embodiment.

DESCRIPTION

Figure 1:
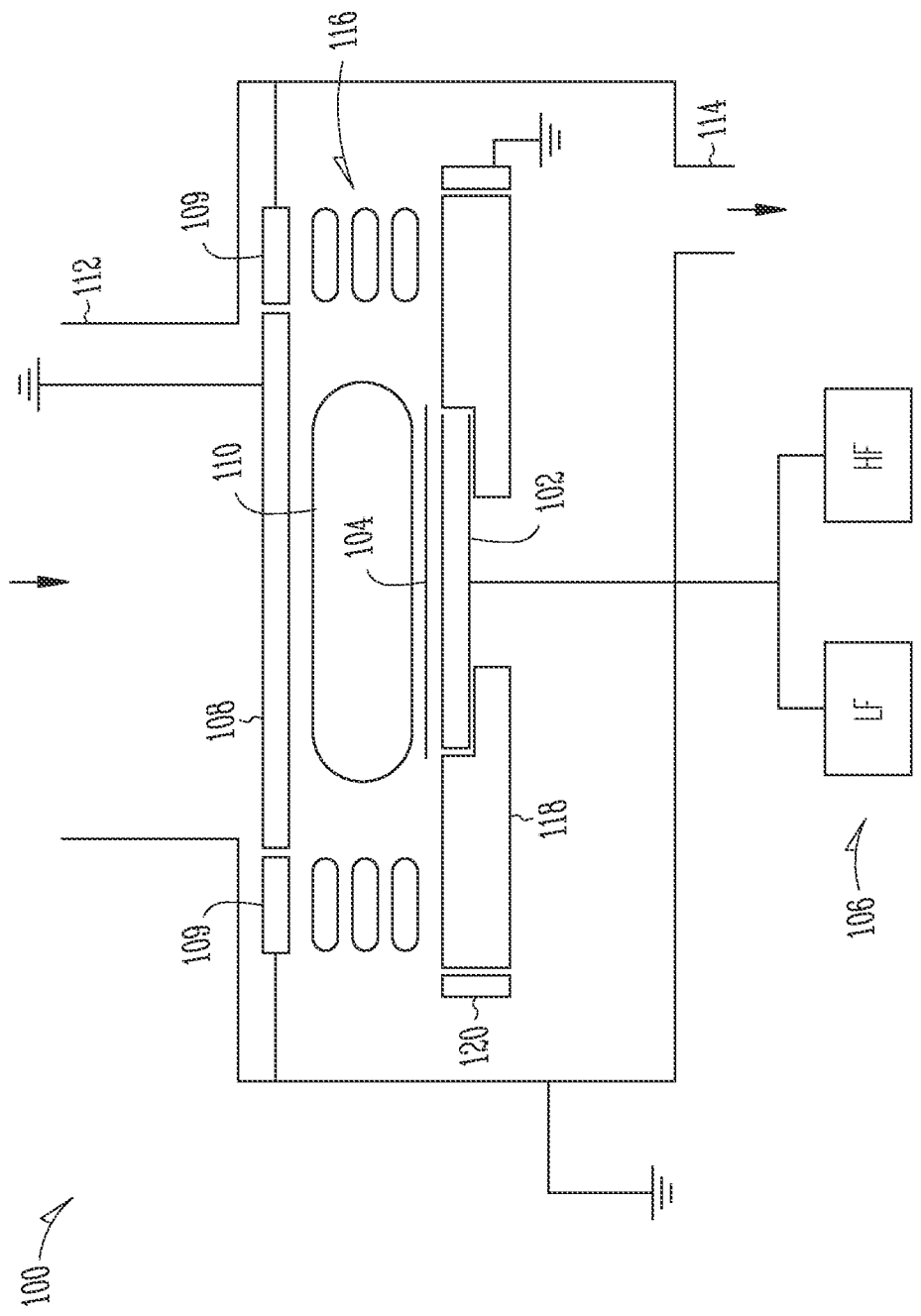
FIG. 1 is a schematic diagram of an example reaction chamber, within which methods and features of the present disclosure may be employed.

The following description includes systems, methods, techniques, instruction sequences, and computing machine program products that embody illustrative embodiments of the present invention. In the following description, for purposes of explanation, numerous specific details are set forth in order to provide a thorough understanding of example embodiments. It will be evident, however, to one skilled in the art, that the present disclosure may be practiced without these specific details.

A portion of the disclosure of this patent document may contain material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever. The following notice applies to any data as described below and in the drawings, that form a part of this document: Copyright Lam Research Corporation, 2018, All Rights Reserved.

An example chamber in which some examples of the present disclosure may be employed, with appropriate chamber modifications for film deposition and control testing, is shown in FIG. 1 of the accompanying drawings. A typical plasma etching (or deposition) apparatus comprises a reactor in which there is a chamber through which reactive gas or gases flow. Within the chamber, the gases are ionized into a plasma, typically by radio frequency (RF) energy. The highly reactive ions of the plasma gas can react with certain materials, such as a polymer mask on a surface of a semi-conductor wafer being processed into integrated circuits (IC's).

Prior to etching, the wafer is placed in the chamber and held in proper position by a chuck or holder which exposes a top surface of the wafer to the plasma gas. There are several types of chucks known in the art. A chuck provides an isothermal surface and serves as a heat sink for the wafer. In one type, a semiconductor wafer is held in place for etching by mechanical clamping means. In another type of chuck, a semiconductor wafer is held in place by electrostatic force generated by an electric field between the chuck and wafer.

FIG. 1 illustrates a representative capacitively-coupled plasma processing chamber 100, representing an exemplary plasma processing chamber of the types typically employed to etch a substrate. Appropriate modifications, as are known in the art, may be made for film deposition. A chuck 102 is a workpiece holder on which a substrate, such as a wafer 104, may be positioned during etching. The chuck 102 may be implemented by any suitable chucking technique, e.g., electrostatic, mechanical, clamping, vacuum, or the like. During etching, the chuck 102 is typically supplied with dual RF frequencies (a low frequency and a high frequency), for example, 2 MHz and 27 MHz, simultaneously by a dual frequency source 106.

An upper electrode 108 is located above the wafer 104. The upper electrode 108 is grounded. FIG. 1 illustrates an etching reactor where the surface of the upper electrode 108 is larger than the surface of the chuck 102 and the wafer 104.

During etching, plasma 110 is formed from etchant source gas supplied via a gas line 112 and pumped out through an exhaust line 114. An electrical insulator ring 109 insulates the upper electrode 108 from the grounded processing chamber 100.

Confinement rings 116 may be placed between the upper electrode 108 and a bottom electrode, such as the chuck 102 in FIG. 1. In general, confinement rings 116 help confine the etching plasma 110 to the region above the wafer 104 to improve process control and to ensure repeatability.

When RF power is supplied to chuck 102 from RF power source 106, equipotential field lines are set up over wafer 104. The equipotential field lines are the electric field lines across the plasma sheath that is between wafer 104 and the plasma 110. During plasma processing, the positive ions accelerate across the equipotential field lines to impinge on the surface of wafer 104, thereby providing the desired etch effect, such as improving etch directionality. Due to the geometry of the upper electrode 108 and the chuck 102, the field lines may not be uniform across the wafer surface and may vary significantly at the edge of the wafer 104. Accordingly, a focus ring 118 may be provided to improve process uniformity across the entire wafer surface, especially along the wafer edge. With reference to FIG. 1, the wafer 104 is shown disposed within a focus ring 118, which may be formed of a suitable dielectric material such as ceramic, quartz, plastic, or the like. Thus, the presence of the focus ring 118 allows the equipotential field lines to be disposed substantially uniformly over the entire surface of the wafer 104.

An electrically conductive metallic enclosure or shield 120 substantially encircles the focus ring 118. The electrically conductive shield 120 is configured to be substantially grounded within the plasma processing chamber 100. The shield 120 prevents the presence of unwanted equipotential field lines outside of the focus ring 118.

The focus ring 118 and/or metallic enclosure 120 may also serve to meet certain electro-magnetic compatibility and radio-frequency (RF) interference requirements in semiconductor manufacturing. Most, if not all, RF systems in etching, cleaning, and deposition tools are required to be enclosed in such a metallic enclosure 120. But the use of the metallic enclosure 120 can generally cause unwanted capacitive and/or inductive parasitic effects which can in turn negatively affect the design of individual RF subsystems and the overall RF system. More particularly, in the case of plasma sources, the magnetic fields emanating out of an RF source coil can produce circulating currents on the metallic enclosure which in turn produce heat and waste the otherwise useful power which ought to be delivered to the plasma 110 for wafer processing purposes. These circulating currents are generally known as eddy currents which also cancel the inductance of source coil. In some examples, this disclosure describes magnetic shielding systems and methods which can be used to reduce the eddy current losses induced by plasma source enclosures.

Figure 2:
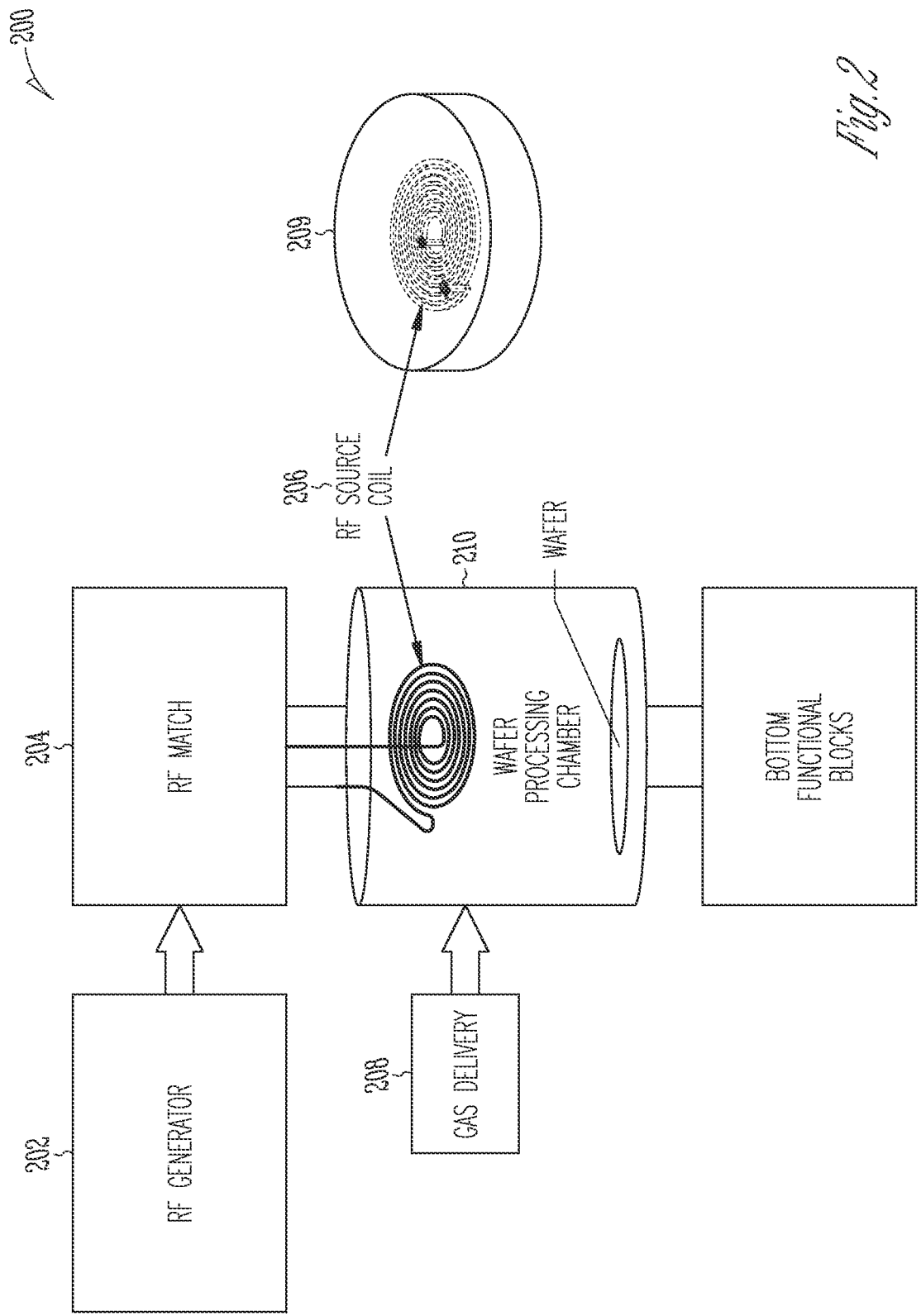
FIG. 2 is a schematic diagram of another example reaction chamber, within which methods and features of the present disclosure may be employed.

Another example of a representative wafer processing system 200 is shown schematically in FIG. 2. Here, an RF generator 202 supplies RF power to the system 200 and the function of the RF match 204 is to counter-match the dynamic plasma load in order to transfer useful power for wafer processing applications. The output of the RF match 204 is connected to an RF source coil 206 which ignites a plasma gas (supplied by a gas delivery box 208) within a wafer processing chamber 210 at a specified pressure and chemistry depending on the process recipe steps.

An aspect of this disclosure is directed to a region 209 in the wafer processing chamber 210 where the RF source coil 206 lies. The purpose of the RF source coil (or plasma antenna) 206 is to produce a strong alternating magnetic field at frequencies of interest (for example, 100 kHz to 300 MHz) for breaking down the atoms of the supplied gas (or plasma 110) into charged particles that aid in water processing like etching, deposition, and so forth. The strong magnetic field from the RF source coil 206 generates eddy current losses which reduce the overall efficiency of the system 200. Conventional attempts to address this problem have included providing a large metallic enclosure of the type described above (e.g. metallic enclosure 120 FIG. 1) but this still suffers from the drawbacks discussed above. Moreover, in size and energy-conscious semiconductor manufacturing companies, there are ever-increasing efforts to reduce the overall size or "footprint" of manufacturing equipment, or constraints on size imposed by customer requirements. Thus, conventional metallic enclosures 120 are becoming increasingly impractical.

In some examples, a "back-shell" is provided to address the problems discussed herein. Generally speaking, a back-shell is configured to "turn back", deflect, or change the path of a magnetic flux line in a processing chamber (e.g. 100, FIG. 1 or 210, FIG. 2). In some examples, a back-shell includes an arrangement of bars or blocks of ferro-magnetic material such as nickel zinc (NiZn), magnesium zinc (MgZn), or manganese zinc (MnZn) ferrites, a ferrite made of Nickel Magnesium (NiMg) alloy, or powdered-iron or a combination of different types thereof. A back-shell may include a planar area or grid-like magnetic shield. In some examples, the magnetic shield is provided in conjunction with metallic plates or ferrite cages designed and arranged as described below to reduce power losses and increase system efficiencies. In some examples, cold-plates or other thermal dissipation methods may also be employed to avoid thermal runaway of the ferro-magnetic materials. Some back-shell examples include a magnetic ferrite cage which may offer certain advantages. For example, in one configuration, the ferrite cage includes an assembly of discrete ferrite bars and does not need to be machined from an entire block of ferrite material. The cost of manufacture is therefore reduced accordingly. Further, air-gaps can be formed in the assembly allowing the ferrite material to cool down relatively quickly, making the overall configuration of the back-shell a more thermally stable design.

This disclosure describes example back-shell designs compatible with high RF power environments and with most thermal dissipation methods. Some examples include saturation-free gapped ferrite components for plasma etch applications. As described further below, eddy current losses in a metallic enclosure can be reduced by about 4% to 90% across different back-shell designs and magnetic concepts.

Figure 3B:
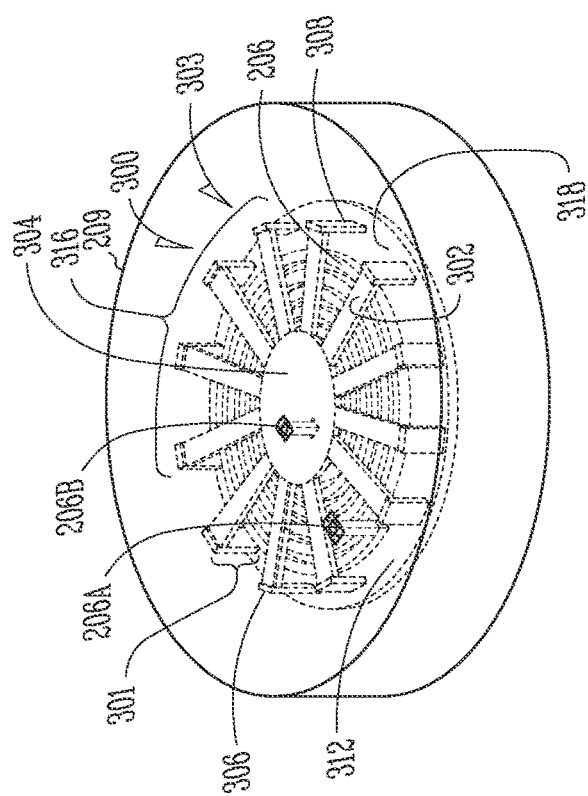
FIGS. 3A-3B are respective pictorial and side views of a magnetic shield, according to an example embodiment.
Figure 3A:
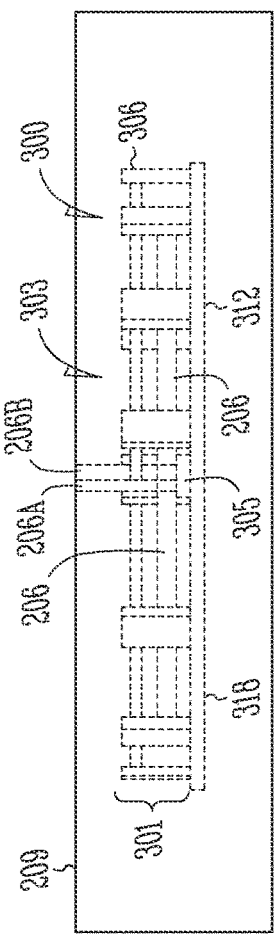

Reference is now made to FIG. 3A which shows a pictorial view of an example magnetic shield 300 for a plasma source. The magnetic shield 300 includes a back-shell 303 disposed in a wafer processing system 200, for example within the region 209 of the wafer processing system 200 shown in FIG. 2. A side view of the back-shell 303 disposed within this region 209 is shown in FIG. 3B.

The RF source coil 206 has power connection points 206A and 206B for providing power to the RF source coil 206. Other power supply arrangements for the RF source coil 206 are possible. As shown in FIGS. 3A-38, the RF source coil 206 is substantially enclosed by the back-shell 303. The back-shell 303 defines, in this instance, an enclosed circular cage in general overall configuration. An upper part 301 of the back-shell 303 includes a number of horizontally disposed, radially-extending ferro-magnetic bars 302. In this example, twelve such bars 302 are provided and they are equally, radially spaced apart from each other, as shown. Each ferro-magnetic bar 302 extends radially outwardly from a ferro-magnetic inner circular plate 304 of the back-shell 303 to a respective outer point on the periphery of the back-shell 303 shown at 306. At respective periphery points 306, each horizontal bar 302 meets, or is joined to, a corresponding vertically-disposed ferro-magnetic bar 308. The inner plate 304, the horizontal bars 302, and the vertical bars 308 define the upper part 301 of the back-shell 303 and, in combination, define an open cage or basket, as shown. The open cage has an open lower mouth that is closed by or at least includes a lower ferro-magnetic plate or disc 312. The RF source coil 206 lies within the volume defined by the upper part 301 and the lower ferro-magnetic plate or disc 312 of the enclosed cage. In some examples, a center bar or "core" 305 is provided to enhance the shielding or flux-shaping ability of the back-shell 303. The open cage has an open side and a bottom side of the RF source coil, when in use, faces the open side.

Figure 4B:
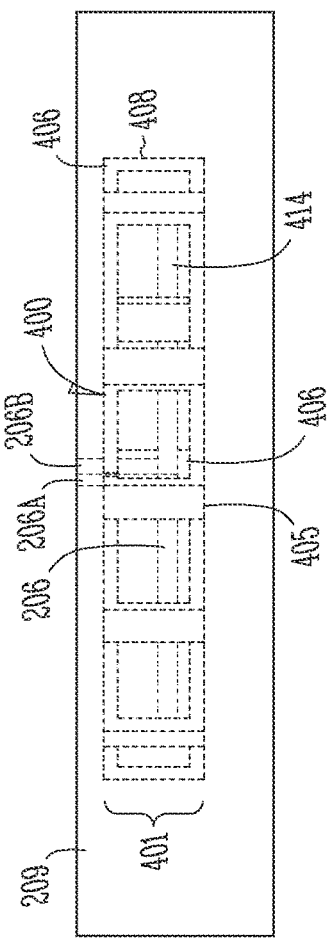
FIGS. 4A-4B are respective pictorial and side views of a magnetic shield, according to an example embodiment.
Figure 4A:
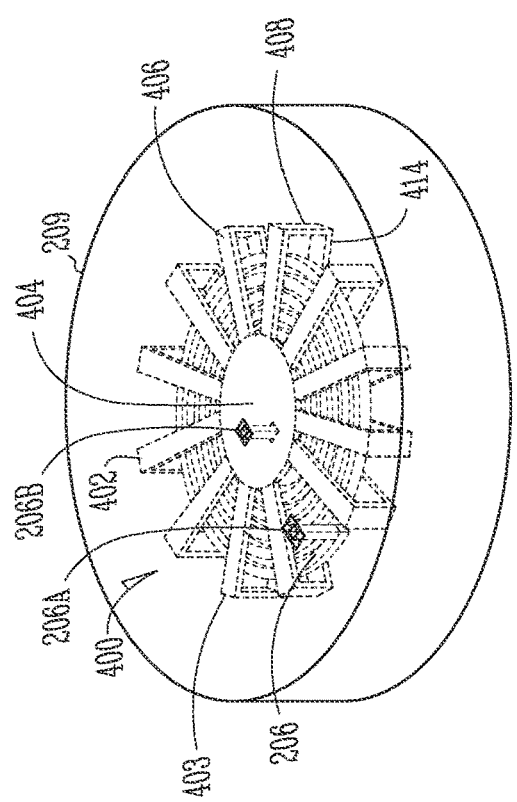

Reference is now made to FIGS. 4A-4B. Here, the magnetic shield 400 illustrated in these views also includes a back-shell 403, but in this case, the open lower mouth of the cage defined by the back-shell 403 is bridged by or at least includes a lower set of radially-spaced, ferro-magnetic bars 414 similar in configuration to the upper set of bars 302 discussed above. In the views shown in FIGS. 4A-4B, the upper set of bars is numbered 402. Each ferro-magnetic bar 402 extends radially outward from a ferro-magnetic inner circular plate 404 of the back-shell 403 to a respective outer point on the periphery of the back-shell 403 shown at 406. Although not visible, a corresponding ferro-magnetic inner circular plate 404 is provided on the underside of the back-shell 403. As in the embodiment described above, the back-shell 403 defines an enclosed circular cage in overall configuration and the RF source coil 206 is substantially enclosed by the back-shell 403. In this example, the cage is comprised substantially of bars, as opposed to the above arrangement in which one cage wall is defined by a circular plate, for example.

An upper part 401 of the back-shell 403 includes the upper set of bars 402 and, in this example, twelve such bars 402 are provided and they are spaced equally and radially apart from each other, as shown. Each bar 402 extends radially outwardly from a ferro-magnetic inner circular plate 404 of the back-shell 403 to an outer point on a periphery of the back-shell 403 shown at 406. At respective periphery points 406, each horizontal bar 402 meets, or is joined to, a corresponding vertically-disposed ferro-magnetic bar 408. Lower ends of the vertical, ferro-magnetic bars 408 are respectively joined to the lower set of radially-spaced, ferro-magnetic bars 414 mentioned above. The inner plate 404 (and its lower counterpart), the horizontal bars 402 and 414, and the vertical bars 408 define together an enclosed ferro-magnetic cage for the back-shell 403, as shown. The RF source coil 206 lies within the enclosed cage of the back-shell 403 when in use. In some examples, a center bar or "core" 405 is provided to enhance the shielding or flux-shaping ability of the back-shell 403.

Figures 5A, 5B:
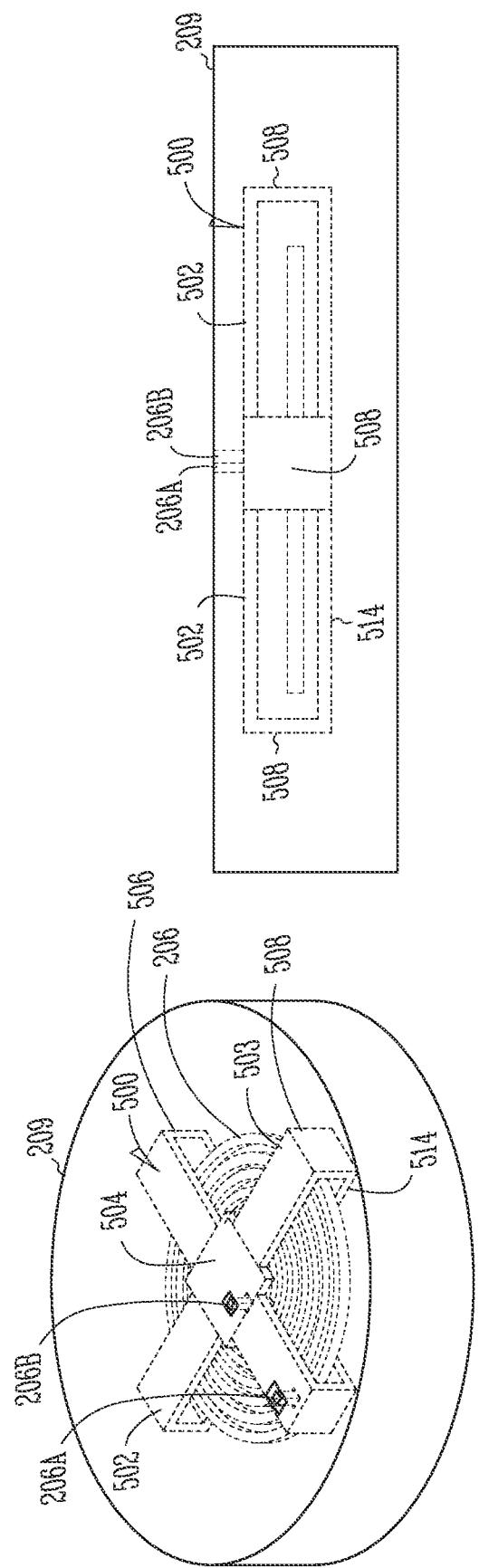
FIGS. 5A-5B are respective pictorial and side views of a magnetic shield, according to an example embodiment.

Reference is now made to FIGS. 5A-5B. These views again show pictorial and side views of an example magnetic shield 500. Components similar to those described above are numbered accordingly. The cage configuration elements in this example include upper and lower sets of ferro-magnetic bars 502 and 514 each including (in this instance) only four relatively wide bars. The bars 502 and 514 are arranged in a substantially crucifix or right-angle configuration. Each bar 502 and 504 is joined at respective radially outer ends 506 to respective vertically arranged ferro-magnetic bars 508. The bars 508 each have a width that matches the width of the bars 502 and 514 to which they are joined.

An alternate cage configuration is further provided by the shape and size of the inner plates. In the embodiments above, the inner plates 304 and 404 are circular. Here, the inner plates instead include a ferro-magnetic plate 504 of square shape. Although not visible, a corresponding ferro-magnetic inner square plate is provided on the underside of the back-shell 503. The horizontal bars 502 and 514, the vertical bars 508, the square plate 504 (and its lower counterpart) define together an enclosed ferro-magnetic cage for the back-shell 503, as shown. The RF source coil 206 lies within the enclosed cage of the back-shell 503 when in use. In some examples, a center bar or core (not visible) is provided to enhance the shielding or flux-shaping ability of the back-shell 503.

Reference is now made to FIGS. 6A-6B. The example magnetic shield 600 depicted in FIGS. 6A-6B has components very similar to the upper part 301 of the back-shell 303 of the magnetic shield 300 depicted in FIGS. 3A-3B which are numbered correspondingly. In this example, however, there are no lower ferro-magnetic parts. The lower mouth of the back-shell 603 is left open and is not closed off, or bridged, by a plate 304 or lower set of bars 302, 308 of the types described above, for example. The RF source coil 206 lies within a region 209 at or close to the open mouth cage of the back-shell 603 when in use.

It will be appreciated that terms such as horizontal, vertical, upper and lower and so forth are used herein with reference to these example orientations as shown in the drawings. In use, different orientations are possible, for example if the RF source coil 206 was oriented in use in a vertical plane instead of a horizontal one, as shown, the example back-shells 303, 403, 503, and 603, and the components that comprise them would assume a correspondingly different orientation accordingly.

Figure 7:
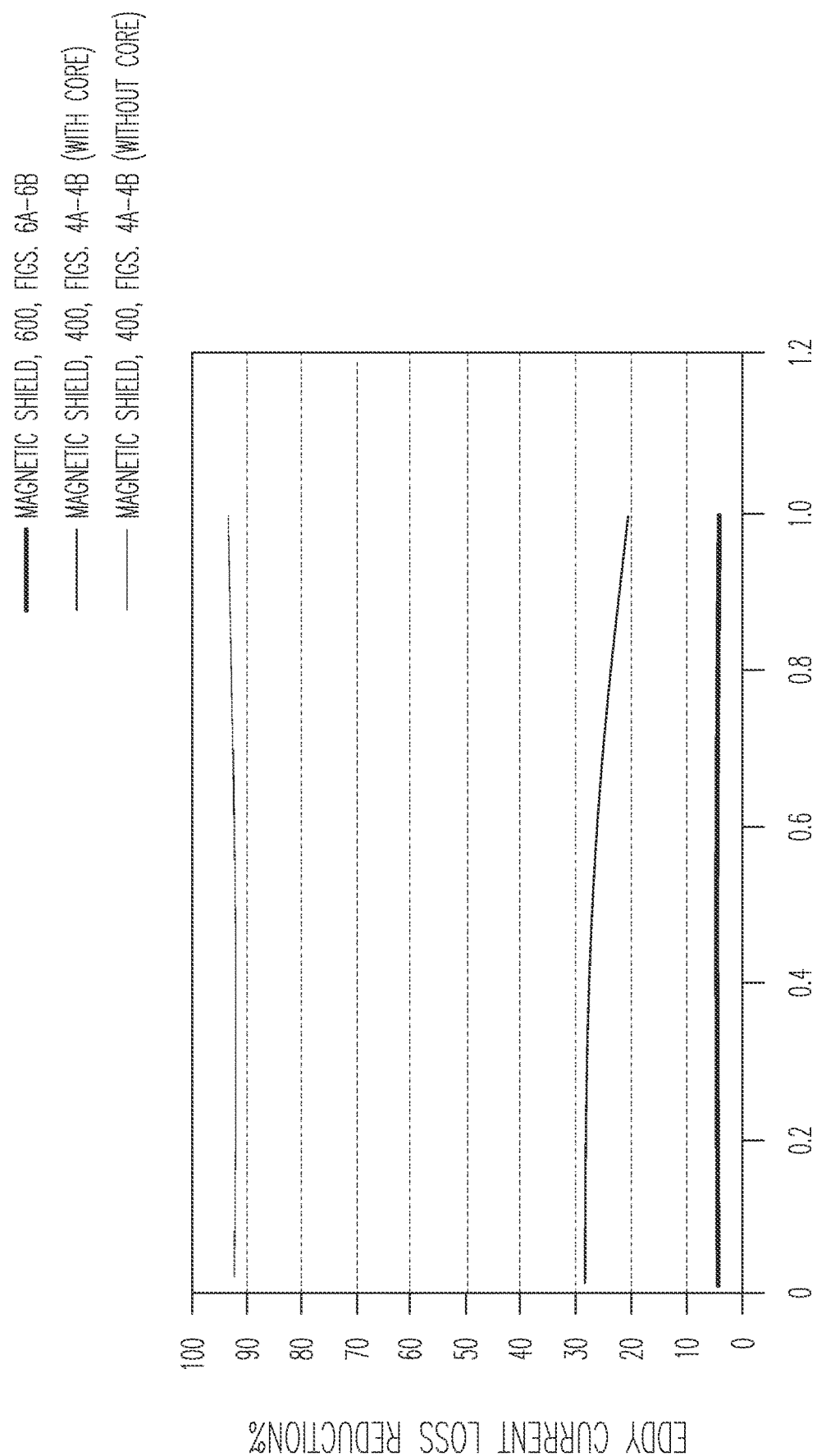
FIG. 7 is a graph illustrating comparative eddy current loss reduction percentages, as exhibited by various example embodiments.
Figure 8:
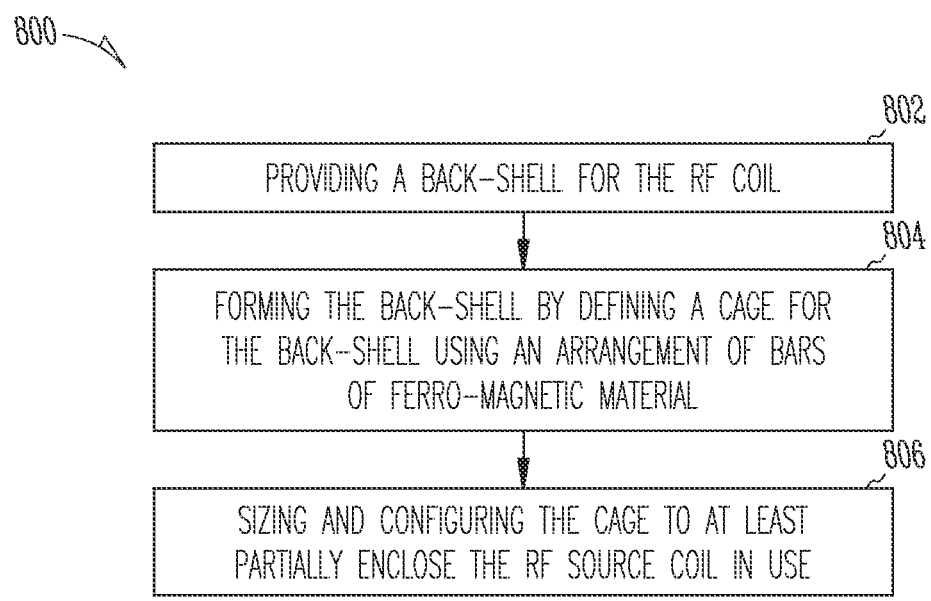
FIG. 8 is flow chart for a method, according to an example embodiment.

Reference is now made to FIG. 7 which shows a graph of comparative shielding effects, or eddy current loss reduction, of some of the embodiments discussed above. The open-mouthed version of the magnetic shield 600 shown in FIGS. 6A-6B performed the least well of those tested, with eddy current loss reduction in the range of 5% across a range of frequencies. The magnetic shield 400 of FIGS. 4A-4B, with the core 405, achieved better test results as a shield as shown, with eddy current loss reduction in the range 20-30% across the same range of frequencies. The magnetic shield 400 of FIGS. 4A-48, without a core, performed significantly better as a shield, with eddy current reduction in the range 90-95% across the same range of frequencies.

Further combinations of the exemplary back-shell configurations described above are possible. For example, the magnetic shields 300, 400, 500, and 600, shown in FIGS. 3A-6B, include circular cage configurations. With appropriate modification, square or rectangular cage configurations are possible. These configurations may be formed by bars 302 or plates 304 making up sides of the cages. The bars 302 may, for example, be regularly or irregularly spaced or may be of different dimensions and thicknesses with respect to each other to suit a given application, for example. The regularly spaced bars 302 of the circular cage configurations described above may not be regularly spaced, in some examples. Various combinations and sizes of cage are possible.

Other configurable design parameters for magnetic shields 300, 400, 500, 600 may include the spacing between the different bars 302, the number of bars 302. to be used, the spacing between the bars 302 and the RF source coil 206, the bars-to-enclosure spacing, varying combinations of different shielding concepts, and one or more combinations of different ferro-magnetic materials. Specially engineered or optimized solutions may differ for different applications. Some design criteria may involve aspects such as source power levels ranging from 100 W to 50 kW, source frequencies ranging from 100 kHz to 300 MHz, the frequency-dependence of loss in enclosure and the ferro-magnetic material itself, and different RF source coil geometries.

For example, the frequency-dependent permeability, permittivity, and loss-characteristics of NiZn ferrite from a Ferroxcube material (material-4B2) may be taken into account during the design of a magnetic back-shell configured for a particular application. NiZn may be preferred in some instances due to its low permittivity which in turn reduces a capacitive parasitic effect between the coils of the RF source coil 206 and the back-shell (e.g. 303, 403, 503, and 603) enclosing it. Higher magnetic permeability materials such as MnZn material may be advantageous in containing magnetic fields, however, these materials may include a higher dielectric constant which may cause, in turn, increased RF coupling to ground reference. Thus, many combinations and configurations of back-shell materials and components are possible.

The present disclosure also includes example methods. In one example, with reference to FIG. 8, a method 800 of magnetically shielding an RF source coil 206 for a plasma source comprises, at least: at operation 802, providing a back-shell (e.g. 303, 403, 503, and 603) for the RF source coil 206; at operation 804. forming the back-shell (e.g. 303, 403, 503, and 603) by defining a cage for the back-shell (e.g. 303, 403, 503, and 603) using an arrangement of bars (e.g. the horizontal or vertical bars described and illustrated in FIGS. 3A-6B) of ferro-magnetic material; and, at operation 806, sizing and configuring the cage to at least partially enclose the RF source coil 206 when in use.

In some examples, the method 800 further comprises defining at least one wall of the cage by forming an array of radially spaced bars extending between a central region of the at least one wall of the cage and an outer dimension thereof. The method 800 may also including forming the back-shell to include any one or more of the back-shell features or elements described herein.

Figure 9:
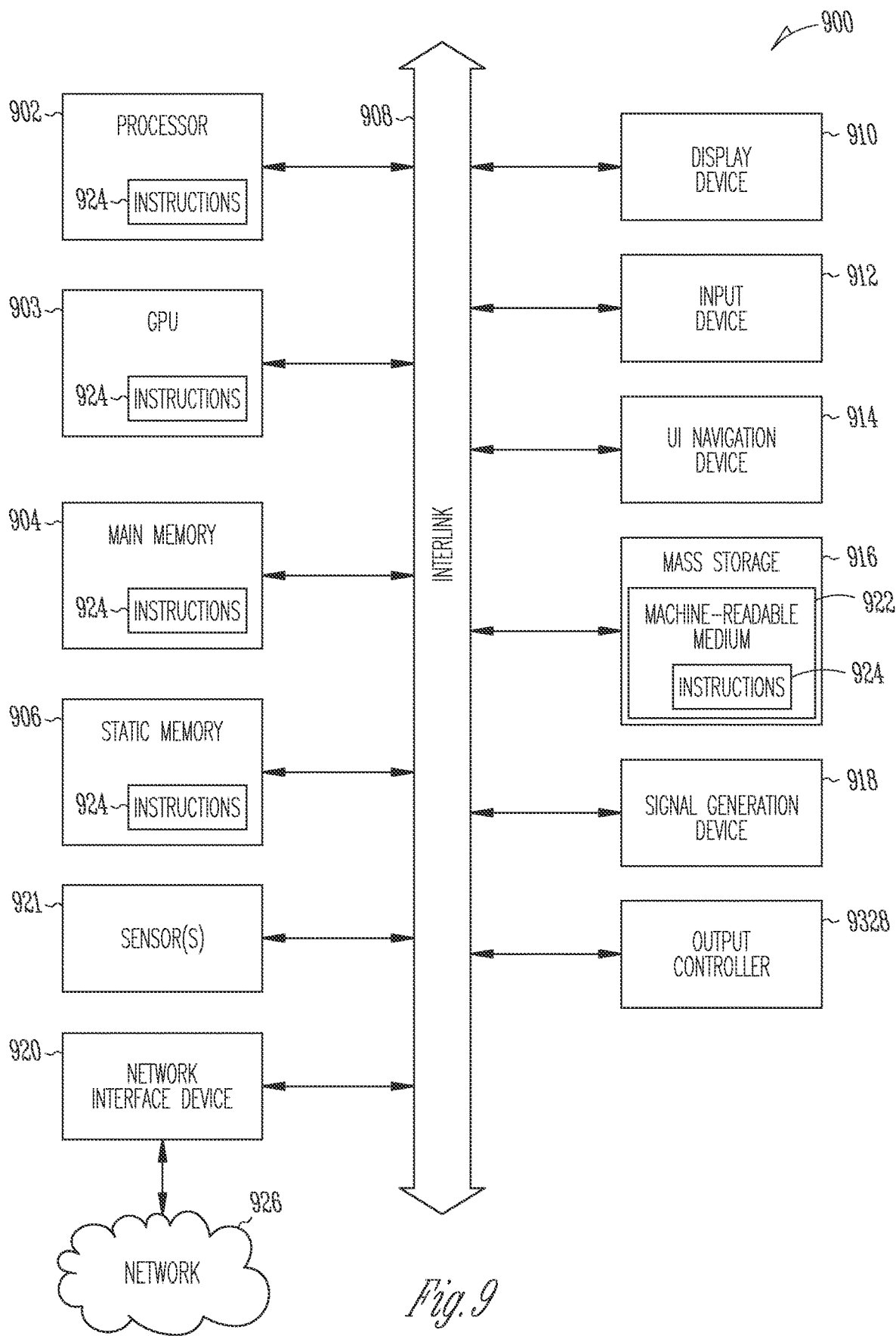
FIG. 9 is a block diagram illustrating an example of a machine upon which one or more example method embodiments may be implemented, or by which one or more example embodiments may be controlled.

In some examples, a non-transitory machine-readable medium includes instructions 924 that, when read by a machine 900, cause the machine 900 to control operations in methods comprising at least the non-limiting example operations summarized above. FIG. 9 is a block diagram illustrating an example of a machine 900 upon which one or more example process embodiments described herein may be implemented, or by which one or more example process embodiments described herein may be controlled. In alternative embodiments, the machine 900 may operate as a standalone device or may be connected (e.g., networked) to other machines. In a networked deployment, the machine 900 may operate in the capacity of a server machine, a client machine, or both in server-client network environments. In an example, the machine 900 may act as a peer machine in a peer-to-peer (P2P) (or other distributed) network environment. Further, while only a single machine 900 is illustrated, the term "machine" shall also be taken to include any collection of machines that individually or jointly execute a set (or multiple sets) of instructions 924 to perform any one or more of the methodologies discussed herein, such as via cloud computing, software as a service (SaaS), or other computer cluster configurations.

Examples, as described herein, may include, or may operate by, logic, and/or a number of components or mechanisms. Circuitry is a collection of circuits implemented in tangible entities that include hardware (e.g., simple circuits, gates, logic, etc.). Circuitry membership may be flexible over time and underlying hardware variability. Circuitries include members that may, alone or in combination, perform specified operations when operating. In an example, hardware of the circuitry may be immutably designed to carry out a specific operation (e.g., hardwired), In an example, the hardware of the circuitry may include variably connected physical components (e.g., execution units, transistors, simple circuits, etc.) including a computer-readable medium physically modified (e.g., magnetically, electrically, by moveable placement of invariant massed particles, etc.) to encode instructions 924 of the specific operation. In connecting the physical components, the underlying electrical properties of a hardware constituent are changed (for example, from an insulator to a conductor or vice versa). The instructions 924 enable embedded hardware (e.g., the execution units or a loading mechanism) to create members of the circuitry in hardware via the variable connections to carry out portions of the specific operation when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 900 may include a hardware processor 902 (e.g., a central processing unit (CPU), a hardware processor core, or any combination thereof), a graphics processing unit (GPU) 903, a main memory 904, and a static memory 906, some or all of which may communicate with each other via an interlink (e.g., bus) 908. The machine 900 may further include a display device 910, an alphanumeric input device 912 (e.g., a keyboard), and a user interface (UI) navigation device 914 (e.g., a mouse). In an example, the display device 910, alphanumeric input device 912, and UI navigation device 914 may be a touch screen display. The machine 900 may additionally include a mass storage device (e.g., drive unit) 916, a signal generation device 918 (e.g., a speaker), a network interface device 920. and one or more sensors 921, such as a Global Positioning System (GPS) sensor, compass, accelerometer, or another sensor. The machine 900 may include an output controller 928, such as a serial (e.g., universal serial bus (USB)), parallel, or other wired or wireless (e.g., infrared (IR), near field communication (NFC), etc.) connection to communicate with or control one or more peripheral devices (e.g., a printer, card reader, etc.).

The mass storage device 916 may include a machine-readable medium 922 on which is stored one or more sets of data structures or instructions 924 (e.g., software) embodying or utilized by any one or more of the techniques or functions described herein. The instructions 924 may also reside, completely or at least partially, within the main memory 904, within the static memory 906, within the hardware processor 902, or within the GPU 903 during execution thereof by the machine 900, In an example, one or any combination of the hardware processor 902, the GPU 903, the main memory 904, the static memory 906, or the mass storage device 916 may constitute machine-readable media 922.

While the machine-readable medium 922 is illustrated as a single medium, the term "machine-readable medium" may include a single medium, or multiple media, (e.g., a centralized or distributed database, and/or associated caches and servers) configured to store the one or more instructions 924.

The term "machine-readable medium" may include any medium that can store, encode, or carry instructions 924 for execution by the machine 900 and that cause the machine 900 to perform any one or more of the techniques of the present disclosure, or that can store, encode, or carry data structures used by or associated with such instructions 924. Non-limiting machine-readable medium examples may include solid-state memories, and optical and magnetic media. In an example, a massed machine-readable medium comprises a machine-readable medium 922 with a plurality of particles having invariant (e.g., rest) mass. Accordingly, massed machine-readable media are not transitory propagating signals. Specific examples of massed machine-readable media may include non-volatile memory, such as semiconductor memory devices (e.g., electrically programmable read-only memory (EPROM), electrically erasable programmable read-only memory (EEPROM)) and flash memory devices; magnetic disks, such as internal hard disks and removable disks; magneto-optical disks; and CD-ROM and DVD-ROM disks. The instructions 924 may further be transmitted or received over a communications network 926 using a transmission medium via the network interface device 920.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A magnetic shield for a plasma source, the magnetic shield comprising:
a cage comprising:
a first wall having a circular profile and at least partially defined by inner and outer radial regions, the first wall including:
a first inner plate disposed in the inner radial region of the first wall, the first inner plate including a ferro-magnetic material and extending outwards from a center of the first inner plate towards the outer radial region; and
an assembly of individual ferrite elements disposed in the outer radial region of the first wall, each individual ferrite element comprising a discrete, planar bar of uniform width and section and including a ferro-magnetic material, the assembly of individual ferrite elements including a first array of radially spaced bars confined to and extending axially in the outer radial region of the first wall, each radially spaced bar individually positioned in relation to the first inner plate of the first wall and joined at a radially inner end thereof to the first inner plate and extending radially outward therefrom, each radially spaced bar being joined to a periphery of the first inner plate at circumferentially spaced apart locations;
a second wall being disposed on an opposite side of the first wall, the second wall having a circular profile and at least partially defined by inner and outer radial regions, the second wall comprising:
a second inner plate disposed in the inner radial region of the second wall, the second inner plate extending outwards from a center of the second inner plate towards the outer radial region; and
an assembly of individual elements disposed in the outer radial region of the first wall, each individual element comprising a discrete, planar bar of uniform width and section, the assembly of individual elements including a second array of radially spaced bars confined to and extending axially in the outer radial region of the second wall, each radially spaced bar individually positioned in relation to the second inner plate of the second wall and joined at a radially inner end thereof to the second inner plate and extending radially outward therefrom, each radially spaced bar being joined to a periphery of the second inner plate at circumferentially spaced apart locations;
a third array of bars arranged such that one end of each of the third array of bars is attached to an outer radial end of a respective one of the first array of radially spaced bars in an orthogonal orientation relative thereto and another end of the each of the third array of bars is attached to an outer radial end of a respective one of the second array of radially spaced bars in an orthogonal orientation relative thereto, the second array being substantially parallel to the first array;
wherein the cage is sized and configured to enclose an RF source coil for the plasma source.

2. The magnetic shield of claim 1, wherein the ferro-magnetic material of the first inner plate or the ferro-magnetic material of the individual ferrite elements includes one or more of a group of materials comprising: a nickel zinc (NiZn) ferrite, a magnesium zinc (MgZn) ferrite, a ferrite made of Nickel Magnesium (NiMg) alloy, a manganese zinc (MnZn) ferrite, a powdered-iron, and a combination thereof.

3. The magnetic shield of claim 1, wherein a circumference of the cage is substantially equidistant from a circumference of an outer periphery of the RF source coil.

4. The magnetic shield of claim 1, wherein the second inner plate includes a ferro-magnetic material.

5. The magnetic shield of claim 1, wherein the ferro-magnetic material of the first inner plate is square.

6. A magnetic shield for a plasma source, the magnetic shield comprising:
a closed cage including an arrangement of bars of ferro-magnetic material, wherein
the arrangement of bars of the closed cage is sized and configured to enclose an RF source coil for the plasma source, and
wherein the arrangement of bars of ferro-magnetic material defines first and second closed sides of the closed cage, each closed side of the closed cage including an array of radially spaced ferro-magnetic bars extending between a central region of each closed side and an outer edge thereof, and including a wall having a circular profile and at least partially defined by inner and outer radial regions, the wall including:
a inner plate disposed in the inner radial region of the wall, the inner plate including a ferro-magnetic material and extending outwards from a center of the inner plate towards the outer radial region; and
an assembly of individual ferrite elements disposed in the outer radial region of the wall, each individual ferrite element comprising a discrete, planar bar of uniform width and section and including a ferro-magnetic material, the assembly of individual ferrite elements including an array of radially spaced bars confined to and extending axially in the outer radial region of the wall, each radially spaced bar individually positioned in relation to the inner plate of the wall and joined at a radially inner end thereof to the inner plate and extending radially outward therefrom, each radially spaced bar being joined to a periphery of the inner plate at circumferentially spaced apart locations;
the closed cage further comprising:
an array of bars arranged such that one end of each of the array of bars is attached to an outer radial end of a respective one of the array of radially spaced bars on the first closed side in an orthogonal orientation relative thereto and another end of each of the array of bars is attached to an outer radial end of a respective one of the array of radially spaced bars on the second closed side in an orthogonal orientation relative thereto.

7. The magnetic shield of claim 6, wherein the ferro-magnetic material of the inner plate or the ferro-magnetic material of the individual ferrite elements includes one or more of a group of materials comprising: a nickel zinc (NiZn) ferrite, a magnesium zinc (MgZn) ferrite, a ferrite made of Nickel Magnesium (NiMg) alloy, a manganese zinc (MnZn) ferrite, a powdered-iron, and a combination thereof.

8. The magnetic shield of claim 6, wherein the first and second closed sides of the closed cage are circular in outline.

9. The magnetic shield of claim 8, wherein a circumference of one of the closed sides of the closed cage is substantially equidistant from a circumference of an outer periphery of the RF source coil.

10. The magnetic shield of claim 6, wherein the ferro-magnetic material of the first inner plate is square.

11. A wafer processing chamber including the RF source coil and the magnetic shield of claim 1 or claim 6.

* * * * *